(12) United States Patent
Motonaga et al.

(10) Patent No.: US 6,458,496 B2
(45) Date of Patent: Oct. 1, 2002

(54) BLANK FOR HALFTONE PHASE SHIFT PHOTOMASK AND HALFTONE PHASE SHIFT PHOTOMASK

(75) Inventors: Toshiaki Motonaga; Toshifumi Yokoyama; Takafumi Okamura; Yoshinori Kinase; Hiroshi Mohri; Junji Fujikawa; Hiro-o Nakagawa; Shigeki Sumida; Satoshi Yusa; Masashi Ohtsuki, all of Tokyo-to (JP)

(73) Assignee: Dai Nippon Printing Co., Ltd., Tokyo-To (JP)

( * ) Notice: Subject to any disclaimer, the term of this patent is extended or adjusted under 35 U.S.C. 154(b) by 96 days.

(21) Appl. No.: 09/736,805

(22) Filed: Dec. 14, 2000

(30) Foreign Application Priority Data

Dec. 15, 1999 (JP) .............................. 11-355522
May 25, 2000 (JP) ....................... 2000-154687

(51) Int. Cl.[7] ................................. G03S 9/00
(52) U.S. Cl. ............................................ 430/5
(58) Field of Search ........................... 430/5, 322, 323, 430/324; 716/19, 21

(56) References Cited

U.S. PATENT DOCUMENTS 6,335,124 B1 * 1/2002 Mitsui et al. ................ 430/5

* cited by examiner

Primary Examiner—S. Rosasco
(74) Attorney, Agent, or Firm—Timothy J. Keefer; Wildman, Harrold, Allen & Dixon

(57) ABSTRACT

A blank for a halftone phase shift photomask in the present invention comprises a transparent substrate and a halftone phase shift film provided thereon, and said halftone phase shift film has a multilayer construction in which at least a first layer capable of being etched with a chlorinated gas and a second layer capable of being etched with a fluorinated gas are disposed in this order from the side near said transparent substrate. A film made of tantalum silicides is suitable to use as the second layer of the halftone phase shift film. When such a blank is first etched with a fluorinated gas and then etched with chlorinated gas, because an etching selective ratio to a transparent substrate made of synthetic quartz and the like can be taken sufficiently while maintaining the applicability to the exposure light with a short wavelength that is characteristic of silicide materials in addition to good chemical stability and good processing properties that are characteristic of tantalum materials, patterning in high precision will be made possible. As a result, it is possible to obtain an ideal halftone phase shift photomask excellent in stability after mask processing and in the applicability to the short wavelength.

34 Claims, 13 Drawing Sheets

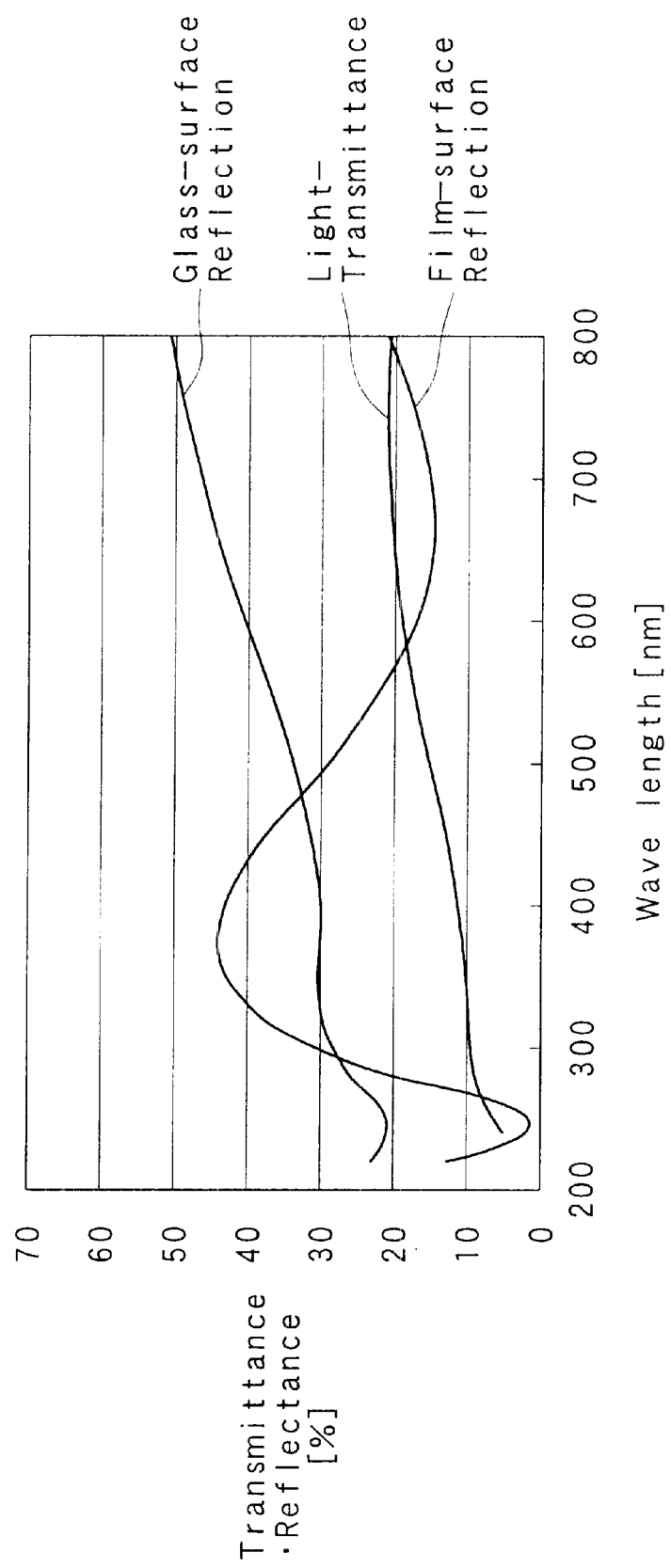

BLANK FOR HALFTONE PHASE SHIFT PHOTOMASK AND HALFTONE PHASE SHIFT PHOTOMASK

CROSS REFERENCE TO RELATED APPLICATION

This application claims the priority of Japan patent application Serial No. P11-355522 filed on Dec. 15, 1999 and Japan patent application Serial No. P2000-154687 filed on May 25, 2000.

BACKGROUND OF THE INVENTION

1. Field of the Invention

The present invention relates to a photomask that is used for producing high density integrated circuits like LSI and VLSI or for forming other microscopic patterns, and to a blank for producing the such a photomask, especially relates to a halftone phase shift photomask by which projection image in fine dimension can be obtained and to a blank for producing the halftone phase shift photomask.

2. Description of the Related Art

Semiconductor integrated circuits, including IC, LSI and VLSI, are produced by repeating the lithography process of using a photomask, especially in case of forming fine circuit patterns, it is studied to use phase shift photomasks disclosed in, for example, Japanese Patent Application Laid-Open No. 58-173744, Japanese Patent Application Publication No. 62-59296 and others.

Although phase shift photomasks with various types of constitution are pro posed, among them, for example, halftone phase shift photomasks disclosed in Japanese Patent Application Laid-Open No. 4-136854, U.S. Pat. No. 4,890,309 and others attract attentions from the viewpoint of possibility of being put to practical use in early time.

As for halftone phase shift photomasks, in literatures, including, for example, Japanese Patent Application Laid-Open Nos. 5-2259 and 5-127361, the improvement of yield rates by reducing the number of production processes, the constitution with possibility of reducing the cost, preferable materials and others have been proposed.

In the following, a common halftone phase shift method and a common halftone phase shift photomask will be briefly explained with reference to the accompanying drawings.

FIG. 14(a) to FIG. 14(d) are views showing the principle of a halftone phase shift method (a halftone phase shift photo lithography), and FIG. 15(a) to FIG. 15(d) are views showing the principle of a photomasking method using a photomask except a phase shift photomask. FIG. 14(a) and FIG. 15(a) are sectional views of a photomask, FIG. 14(b) and FIG. 15(b) show the amplitude of light on a photomask, FIG. 14(c) and FIG. 15(c) show the amplitude of light on a wafer, and FIG. 14(d) and FIG. 15(d) show the strength of light on a wafer. Reference numerals 911 and 921 denote substrates, 912 denotes a halftone phase shift film in which the phase of incident light is substantially shifted by 180 degree and the transmittance of transmitted light is within the range of 1 to 50%, 922 denotes a 100% light shielding film, and 913 and 923 denote incident light.

In a conventional photomasking method, as shown in FIG. 15(a), the 100% light shielding film 922 made of chromium or the like is formed on the substrate 921 consisting of quartz glass to form a light transmission part (an aperture) in a desired pattern. In this case, the distribution of light strength on a wafer is broadened toward the end as shown in FIG. 15(d), resulting in inferior resolution.

On the other hand, in a halftone phase shift method, because the phase of light transmitted through the halftone phase shift film 912 is substantially inverted to that of light transmitted through the aperture, light strength on boundary parts of patterns on a wafer becomes zero as shown in FIG. 14(d), which can prevent light from broadening toward the end. In this case, therefore, resolution can be improved.

Here, it should be noted that, in phase shift photo lithography that belongs in types except a halftone phase shift method, because a light shielding film and a phase shifter film are formed in different patterns with different materials, the plate making process is needed to be repeated at least 2 times, while because it is enough to form only one pattern in the halftone phase shift photo lithography, it is essentially needed to carry out the plate making process only once and this is a big advantage in halftone phase shift lithography.

In the halftone phase shift film 912 of a halftone phase shift photomask, two functions, that is, phase inversion and permeability control are needed. Out of them, as for the phase inversion function, it is sufficient that phase will be substantially inverted between exposure light transmitting through the halftone phase shift film 912 and exposure light transmitting through the aperture. Here, if the halftone phase shift film 912 is considered as an absorption film that is shown, for example, in pages 628 to 632 of "Principles of Optics" written by M. Born and E. Wolf, since multiplex interference can be ignored, phase change ōof vertically transmitted light will be calculated using the following expression. And when the value of φ is within the range of nπ±π/3 (n is an odd number), the above-mentioned phase shift effect will be obtained.

$$\phi = \sum_{k=1}^{m-1} \chi^{k,k+1} + \sum_{k=2}^{m-1} 2\pi(u_k - 1)d_k/\lambda \qquad \text{Expression (1)}$$

Further, in expression (1), φ is a phase change caused to light vertically transmitting through a photomask in which a multilayer film of (m−2) layers is formed on the substrate, $\chi^{k,k+1}$ is a phase change occurring in the interface between a $k^{th}$ layer and a $(k+1)^{th}$ layer, $u_k$ and $d_k$ are the refractive index and film thickness of the $k^{th}$ layer, respectively and λ is the wavelength of exposure light, providing that the layer of k=1 is the above mentioned transparent substrate and the layer of k=m is air.

On the other hand, the transmittance of exposure light transmitted through the halftone phase shift film 912 for obtaining a halftone phase shift effect is determined by the dimension, area, arrangement, shape and the like of a transcription pattern, and differs depending on patterns.

In order to substantially obtain the above-mentioned effect, the transmittance of exposure light transmitted through the halftone phase shift film 912 should be within the range of the optimum transmittance±some percents, where the center value is the optimum transmittance determined by the pattern.

Generally, this optimum transmittance greatly varies within the wide range of 1 to 50% depending on transcription patterns when the transmittance in the aperture of the halftone phase shift film is set to 100%. That is, in order to adapt to all patterns, halftone phase shift photomasks having various transmittances are needed.

In a practical situation, the phase inversion function and the transmittance control function are determined by a complex refractive index (a refractive index and an extinction coefficient) and film thickness of a material forming the halftone phase shift film. In case of a multilayer structure, the phase inversion function and the transmittance control function are determined depending on a complex refractive index and a film thickness of each layer. In other words, it is possible to use a material adjustable its film thickness so as to control phase difference calculated by the above mentioned expression (1) within the range of $n\pi\pm\pi/3$ (n is an odd number) as a halftone phase shift film of a halftone phase shift photomask.

As thin film materials for photomask patterns, tantalum based materials are commonly known as shown in, for example, Japanese Patent Application Laid-Open No. 57-64739, Japanese Patent Application Publication Nos. 62-51460 and 62-51461. Because tantalum based materials are extremely excellent in processing properties, chemical stability after being processed, and others, they have been vigorously studied and tried to apply them in halftone phase shift films by oxidizing ornitriding tantalum as disclosed in, for example, Japanese Patent Application Laid-Open Nos. 5-257264, 7-134396 and 7-281414. Furthermore, with the advancement of shortening the wavelength of exposure light in connection with the minuteness of LSI patterns, studies have also been carried out to use materials of tantalum silicides that are able be applied to exposure light of shorter wavelength as shown in, for example, Japanese Patent Application Laid-Open No. 6-83027.

However, generally, dry etching of tantalum silicides is carried out using an etching gas of fluorinated compounds, including $CF_4$, $CHF_3$, $SF_6$, $C_2F_6$, $NF_3$, $CF_4+H_2$ and $CBrF_3$, but there was such a problem that in this case, the fluorinated-etching gas also etches a transparent substrate of synthetic quartz and the like, and therefore, dry etching with high precision can not be carried out. Generally, concerning the production of a halftone phase shift photomask, the high precision control of the phase angle is indispensable, but if a quartz substrate is also etched when etching a halftone phase shift film as mentioned above, errors will be induced in phase difference by etching depth. Furthermore, because etching of a halftone phase shift film has an important role in controlling pattern dimensions, it is desired to set conditions so that the uniformity and reproducibility of pattern dimensions can be obtained as good as possible, but there may be such a problem that a margin in the range for setting conditions becomes narrow due to the addition of a new parameter of an etching selective ratio to quartz. This problem will be induced because the optimum etching process for attaching much importance to dimension control does not always accord with that for attaching much importance to phase difference control. That is, materials of tantalum silicides for a halftone phase shift film in themselves show excellent processing properties and chemical stability after being processed, but when phase difference control in high degree is further taken into consideration, the patterning with high precision will be difficult.

SUMMARY OF THE INVENTION

An object of the present invention is to provide a halftone phase shift photomask capable of providing an improved etching selective ratio to substrate materials such as a quartz substrate, as well as maintaining desirable properties of tantalum silicides including applicability to exposure light with the short wavelength, excellent processing properties, and chemical stability after processing.

Another object of the present invention is to provide blanks for a halftone phase shift photomask that permit to form halftone phase shift photomasks with such excellent properties.

Another object of the present invention is to provide a halftone phase shift photomask capable of providing an etching selective ratio to substrate materials such as a quartz substrate whether a material of tantalum silicides is used or not.

A halftone phase shift photomask to be provided in the present invention comprises a transparent substrate and a halftone phase shift film provided on said transparent substrate, characterized in that said halftone phase shift film has a multilayer construction in which at least a first layer capable of being etched with a chlorinated gas and a second layer capable of being etched with a fluorinated gas are disposed in this order from the side near said transparent substrate, and that said halftone phase shift film also comprises apertures made by removing part of said halftone phase shift film in a prescribed pattern.

The present invention also provides a blank enabling to produce such a halftone phase shift photomask. The blank for a halftone phase shift photomask comprises a transparent substrate and a halftone phase shift film provided on said transparent substrate, characterized in that said halftone phase shift film has a multilayer construction in which at least a first layer capable of being etched with a chlorinated gas and a second layer capable of being etched with a fluorinated gas are disposed in this order from the side near to said transparent substrate.

When the blank having the halftone phase shift film with such a multilayer construction is first etched with a fluorinated gas, the second layer of the halftone phase shift film is patterned in a prescribed shape. Next, the halftone phase shift film of the blank is etched with a chlorinated gas in the pattern coincident with that etched with the fluorinated gas, and thus the first layer of the halftone phase shift film is patterned coincidentally with the second layer, but the transparent substrate is not substantially etched. As a result, only the halftone phase shift film can be precisely etched. And it is also possible to control freely the phase angle and transmittance by forming 2 or more layers constituting a halftone phase shift film with respective different materials and by controlling the thickness of each layer.

Because the phase angle and transmittance of a halftone phase shift photomask can be controlled in high precision as well as improving an etching selective ratio to the transparent substrate, it becomes possible to obtain a projection image with precise minute dimensions by using the halftone phase shift photomask.

As a method of improving the etching selective ratio to the substrate, it is known to provide an etching stopper layer between the substrate and the halftone phase shift film. By this known method, however, the etching stopper layer will remain in the aperture of the accomplished halftone phase shift photomask to affect the phase angle and light transmittance in the aperture. To the contrary, any no etching stopper layer remains at the aperture in the present invention.

The first layer of the halftone phase shift film is disposed at a portion near the transparent substrate, and it is formed of a material capable of being etched with a chlorinated gas. For example, the material capable of being etched with a chlorinated gas may be selected from among tantalum based materials and chromium based materials, and the first layer can be formed of the thus selected material.

The second layer of the halftone phase shift film is disposed at a portion distant from the transparent substrate in comparison with the first layer. It is preferable that the second layer is formed of tantalum silicide based material.

Though the tantalum silicide based material does not have so large etching selective ratio to the transparent substrate, it is excellent in processing properties, chemical stability and applicability to a light exposure with a short wavelength. Accordingly, when a halftone phase shift layer made of the tantalum silicide based material (namely, the second layer) is formed on the transparent substrate via the other halftone phase shift layer having a large etching selective ratio to the transparent substrate (namely, the first layer), it is possible to use the layer made of the tantalum silicide based material with a large etching selective ratio.

BRIEF DESCRIPTION OF THE DRAWINGS

FIG. 6(a) and FIG. 6(b) show the etching process of a light shielding layer, and FIG. 6(c) and FIG. 6(d) schematically show sections of etching forms.

FIG. 7(a) shows the section of the blank and FIG. 7(b) shows the section of a test piece obtained by a lift off method.

FIG. 10(a) shows the section of the blank and FIG. 10(b) shows the section of a test piece obtained by a lift off method.

FIG. 11 is a graph showing the spectra of transmittance and reflectance of the blank for a halftone phase shift photomask obtained in example 3.

DESCRIPTION OF THE PREFERRED EMBODIMENTS

Figure 1:
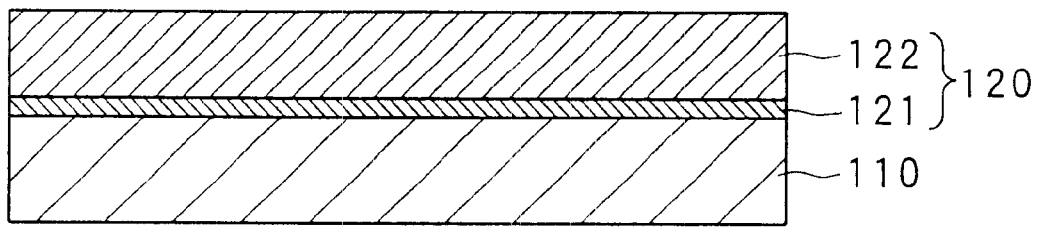
FIG. 1 is a view schematically showing a section of an example (a first example) of a blank for a halftone phase shift photomask in the present invention.

A halftone phase shift photomask to be provided in the present invention comprises a transparent substrate and a halftone phase shift film provided on the transparent substrate, the halftone phase shift film is characterized in that it has a multilayer construction in which at least a first layer that can be etched with a chlorinated gas and a second layer that can be etched with a fluorinated gas are disposed in this order from the side near the transparent substrate, and it also comprises an aperture made by removing part of the halftone phase shift film in a prescribed pattern.

Furthermore, the present invention will provide a blank for a halftone phase shift photomask, with which a halftone phase shift photomask like this can be made. The Blank for a halftone phase shift photomask to be provided by the present invention comprises a transparent substrate and a halftone phase shift film provided on the transparent substrate, the halftone phase shift film is characterized in that it has a multilayer construction in which at least the first layer that can be etched with a chlorinated gas and the second layer that can be etched with a fluorinated gas are disposed in this order from the side near the transparent substrate. The transparent substrate is formed with a transparent material, for example, synthetic quartz that can be etched with a fluorinated gas but not etched with a chlorinated gas.

The present invention has succeeded in developing a halftone phase shift photomask in which the pattern processing is possible in high precision and a blank theref or by making a halftone phase shift film to be a multilayer construction and by forming one layer of the multilayer with a material that can take a sufficiently high etching selective ratio to a transparent substrate.

In the present invention, on a transparent substrate of the blank for a halftone phase shift photomask, a half tone phase shift film having a multilayer of 2 or more plies is formed. Individual layer constituting a halftone phase shift film is formed with a halftone phase shift material different from that of forming adjacent layers. In the plural layers constituting a halftone phase shift film, the first layer, which is the nearest layer to the transparent substrate, is formed with a material that can be etched with a chlorinated dry etching gas and is preferably provided just on the transparent substrate. As a chlorinated dry etching gas, it is possible to use a gas containing $Cl_2$, $CH_2Cl_2$ and the like, or a gas in which $O_2$ is further added in such a gas, but such a chlorinated gas substantially can not etch a transparent substrate made of synthetic quartz and the like. Moreover, the second layer to be laminated adjacent to the first layer on the etched surface side of the above-mentioned first layer is formed with a material that is possible to be etched with a fluorinated dry etching gas.

When the blank having a halftone phase shift film with a multilayer construction like this are first etched in a prescribed pattern with a fluorinated dry etching gas, the second layer of the halftone phase shift film is etched. Then, when the halftone phase shift film of this blank is next etched in the same pattern state with a chlorinated dry etching gas, the first layer of the halftone phase shift film is etched but the transparent substrate is not substantially etched. As a result, it is possible to etch only the halftone phase shift film precisely. And it is also possible to control freely the phase angle and transmittance by forming 2 or more layers constituting a halftone phase shift film with respective different materials and by controlling the thickness of each layer.

Because the phase angle and transmittance of a halftone phase shift photomask can be controlled in high precision, it becomes possible to obtain a projection image with precise minute dimensions by using the half tone phase shift photomask.

As a method of improving the etching selective ratio to a substrate, it is known to provide an etching stopper layer between the substrate and the halftone phase shift film. By this known method, however, the etching stopper layer will be remained in the aperture of the accomplished halftone phase shift photomask to affect the phase angle and light transmittance in the aperture. To the contrary, since no etching stopper layer is remained in the aperture in the present invention, it is possible to control in high precision the phase difference and light transmittance difference between the aperture and pattern part of the halftone phase shift film.

In the present invention, as the second layer (that is, a layer outer than the first layer) of the halftone phase shift film, a layer of a halftone phase shift material having an element composition comprising tantalum, silicon and oxygen as essential elements is preferably used. A layer of a halftone phase shift material having an element composition comprising tantalum, silicon and oxygen as essential elements is a layer containing at least one of TaSix, TaOx, SiOx and TaSixOy as a main component.

In cases where the second layer is formed with a material of such tantalum silicides, it is possible to maintain excellent processing properties and chemical stability after processing that are characteristic of tantalum based materials, and the applicability to exposure light of the short wavelength that is characteristic of silicide based materials. A material of tantalum silicides can be used as a halftone phase shift film because they have an enough light transmission property to fluorinated krypton excimer laser lithography (wavelength of exposure light is 248 nm) and fluorinated argon excimer laser lithography (wavelength of exposure light is 193 nm).

Furthermore, because the first layer of the halftone phase shift film can be etched without substantially invading a transparent substrate made of synthetic quartz and the like by making the halftone phase shift film to be multilayer and by preparing the first layer, which can be etched with a chlorinated gas, between the second layer having an element composition comprising tantalum, silicon and oxygen as essential elements and the transparent substrate, it is possible to take an etching selective ratio to the transparent substrate sufficiently high.

Therefore, it is possible to realize high precision patterning by the use of a layer having an element composition comprising tantalum, silicon and oxygen as essential elements as the second layer, because an etching selective ratio to a transparent substrate made of synthetic quartz and the like can be taken sufficiently while maintaining the applicability to the short wavelength that is characteristic of silicide materials in addition to good chemical stability and good processing properties that are characteristic of tantalum materials. As a result, it is possible to obtain an ideal mask member that is excellent in stability after mask processing and in the applicability of short wavelength. Moreover, a halftone phase shift photomask with high precision can be produced in a high yield and low cost.

The first layer of a halftone phase shift film is prepared near a transparent substrate and is a layer that can be dry etched with a chlorinated gas. This first layer can be formed with a material having an element composition comprising tantalum or chromium as an essential element.

Figure 8:
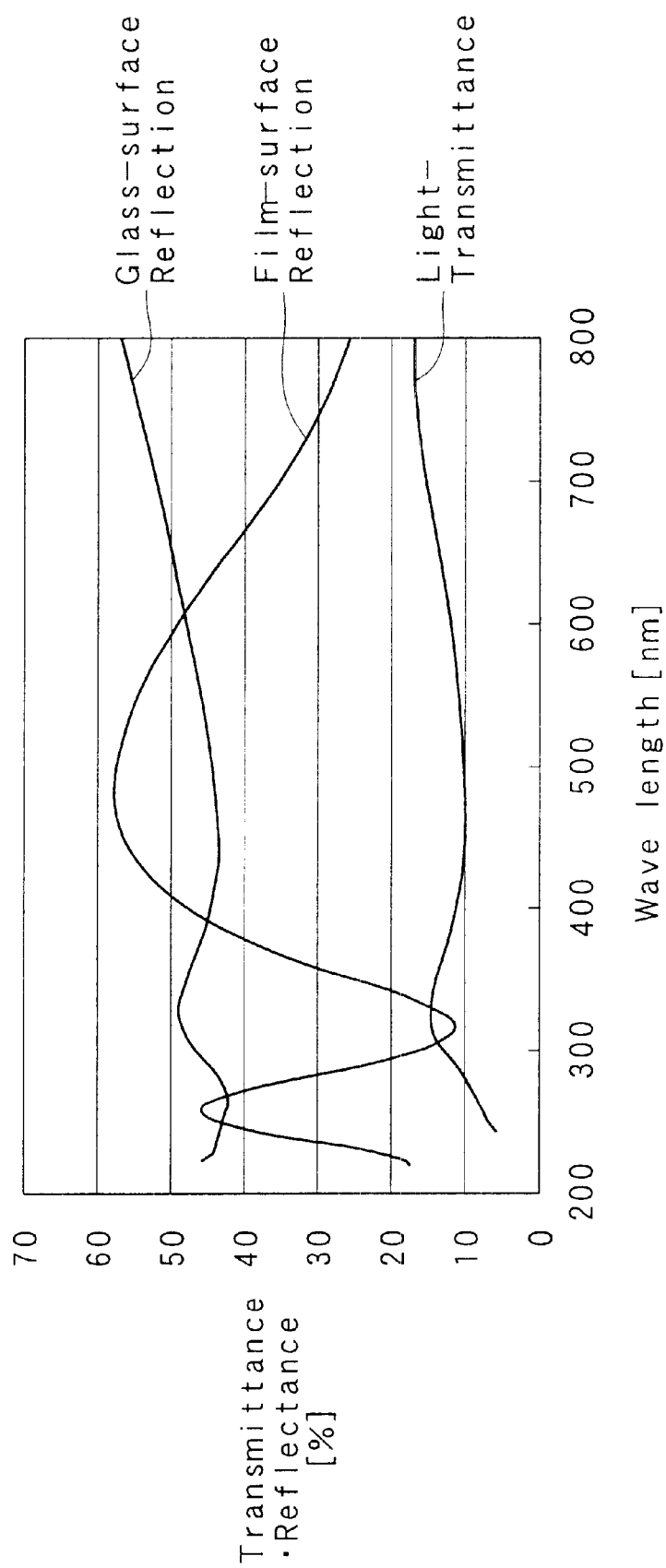
FIG. 8 is a graph showing the spectra of transmittance and reflectance of the blank for a halftone phase shift photomask obtained in example 1.

As a material that has an element composition comprising tantalum as an essential element and can be form the first layer, a material having an element composition in which tantalum is an essential element and silicon is not contained substantially can be used. FIG. 8 shows the typical optical characteristic spectra of a blank for a halftone phase shift photomask that can be obtained by laminating the first layer formed of such a tantalum based material and the second layer having an element composition comprising tantalum, silicon and oxygen as essential elements. Generally, these optical characteristic spectra are considered to be sufficiently applicable in practical use, but there are some cases where reflectance on the film surface is somewhat high. That is, the reflectance of exposure light on the film surface is required to be 30% or less (from 0 to 30%). preferably 20% or less in some cases. In case of such a requirement, the third layer may be prepared between the half tone phase shift film and the transparent substrate to change the reflectance spectra. Even if the etching selective ratio of the third layer to the transparent substrate is low, sufficiently thin thickness of the third layer will not cause large errors in phase difference. As an example, it is possible to form a film having an element composition comprising tantalum, silicon and oxygen as essential elements in thickness of several tens to 100 angstroms (Å) between the first layer in which tantalum is an essential element and silicon is substantially not contained and the transparent substrate. In this case, it becomes possible to change freely the reflectance spectrum by changing the thickness of the third thin film within the above-mentioned range, which does not have large influence to the phase difference of the mask even if the etching selective ratio is worse, because of thin film thickness.

Furthermore, as another method, it is possible to control the reflectance spectrum by adding a very small amount of oxygen and/or nitrogen to a material in which tantalum is an essential element and silicon is substantially not contained. Therefore, the first layer of the halftone phase shift film can be formed with a material having an element composition comprising further oxygen and/or nitrogen, along with tantalum as essential components. A layer of a material having an element composition comprising oxygen and/or nitrogen, along with tantalum as essential components is a layer that contains at least one of TaNx, TaOx and TaNxOy, along with Ta as main components.

As a material that has an element composition comprising chromium as an essential element and can form the first layer, a material having an element composition comprising oxygen, fluorine and/nitrogen, along with chromium as essential elements can be used. This material contains one or more components of metal chromium (Cr), CrOx, CrFx, CrNx, CrFxOy, CrNxOy, CrFxNy and CrFxNyOz.

As another material that has an element composition comprising chromium as an essential element and can form the first layer, a material having an element composition comprising silicon, along with chromium as an essential element can be used. This material contains metal chromium (Cr) and/or CrSix.

A further material that has an element composition comprising chromium as an essential element and can form the first layer, a material having an element composition comprising tantalum, along with chromium as an essential element can be used. This material contains metal chromium (Cr) and/or a chromium-tantalum alloy (CrTax).

In addition, it is possible to use a material having an element composition comprising one or more of the above-mentioned oxygen, fluorine, nitrogen, silicon, tantalum and others, along with chromium as essential elements. For example, in cases where tantalum and silicon, along with chromium are essential elements, the material contains at least one of CrSix, TaSix and CrTaxSiy as a main components, along with one or both of metal chromium (Cr) and a chromium-tantalum alloy (CrTax).

Furthermore, in cases where tantalum, oxygen, fluorine and nitrogen, along with chromium are essential elements, the material contains at least one of CrOx, CrFx, CrNx, CrFxOy, CrNxOy, CrFxNy, CrFxNyOz, TaOx, TaFx, TaNx, TaFxOy, TaNxOy, TaFxNy, TaFxNyOz, CrTaxoy, CrTaxFy, CrTaxNy, CrTaxFyOz, CrTaxNyOz, CrTaxFyNz and CrTawFxNyOz, along with one or both of metal chromium (Cr) and a chromium-tantalum alloy (CrTax) as main components.

A halftone phase shift film with multilayer construction having at least the first layer and the second layer is preferable to be formed on a transparent substrate so that the phase difference φ obtained from the following expression (1) is within the range of nπ±π/3 radian (here, n is an odd number):

$$\phi = \sum_{k=1}^{m-1} x^{k,k+1} + \sum_{k=2}^{m-1} 2\pi(u_k - 1)d_k/\lambda \qquad \text{Expression (1)}$$

wherein, φ is a phase change caused to light vertically transmitting through a photomask or a blank for a photomask in which a halftone phase shift film consisting of (m−2) layers is formed on the transparent substrate, $\chi^{k,k+1}$ is a phase change occurring in the interface between a $k^{th}$ layer and a $(k+1)^{th}$ layer, $u_k$ and $d_k$ are the refractive index and film thickness of the $k^{th}$ layer, respectively, and λ is the wavelength of exposure light, providing that the layer of k=1 is the transparent substrate and the layer of k=m is air.

Moreover, it is preferable that a halftone phase shift film is formed in such a film thickness as the halftone phase shift film has the transmittance of exposure light within the range of 1 to 50% provided that a transparent substrate has a transmittance of exposure light as 100%, in order to control transmittance to be optimum corresponding to any pattern.

In a halftone phase shift photomask or a blank therefor of the present invention, a light shielding film may be formed in succession just on or under a halftone phase shift film. It is possible to prevent the solarization of the resist due to the overlap of adjoining shots in the process of a halftone phase shift photo lithography by preparing a light shielding layer. Further, it is possible to control the transcription properties of a transcribing and forming pattern with this light shielding film.

For the reason that a light shielding film is required to be excellent in plate making properties, durability and others, a light shielding film is preferable to be formed using a material having an element composition comprising chromium as an essential element. In case of preparing a light shielding film of chromium materials, plate making of a light shielding film may be carried out using a wet etchant of cerium nitrates after a pattern in a halftone phase shift film is formed by a gas dry etching as described later.

In the present invention, there are some cases where a film comprising chromium and/or a chromium tantalum alloy as main components is formed as the first layer of the half tone phase shift film. In this case, it is feared that the first layer of the halftone phase shift film is invaded by a wet etchant of cerium nitrates to cause some problems in pattern formation.

However, corrosive resistant of the first layer comprising chromium and/or a chromium tantalum alloy as main components to wet etchants can be improved by adding oxygen, fluorine and/or nitrogen as mentioned above, or by making an alloy through the addition of an other metal like silicon, tantalum or the like.

Furthermore, because as mentioned later, the film thickness of the first layer comprising chromium and/or a chromium tantalum alloy as main components is often thin, the layer has inherently low possibility of being invaded by wet etchants, and if the layer is invaded, the invasion is often stopped at the degree substantially not to adversely affect the transcription property.

The production method of a blank for a halftone phase shift photomask and the method of producing a halftone phase shift photomask by carrying out the halftone phase shift photo lithography using the blank in the present invention will be explained in the following.

FIG. 1 is a schematically sectional view showing a first example of a blank for a halftone phase shift photomask in the present invention. In FIG. 1, a reference numeral 110 denotes a transparent substrate, 120 denotes a halftone phase shift film with multilayer construction, 121 denotes a first layer having an element composition comprising chromium as an essential element, and 122 denotes a second layer having an element composition comprising tantalum, silicon and oxygen as essential elements.

The Blank for a halftone phase shift photomask in the first example have the halftone phase shift film 120 having a multilayer construction composed of the second layer 122 having an element composition comprising tantalum, silicon and oxygen as essential elements and the first layer 121 having an element composition comprising chromium as an essential element, and the first layer 121 and the second layer 122 are laminated and formed in this order on the transparent substrate 110.

And, the second layer 122 has processing properties and chemical stability, which are characteristic of tantalum based materials, and can be etched with a fluorinated gas. The first layer 121 can be etched with a chlorinated gas after etching the second layer 122 with a fluorinated gas. At this time, since the transparent substrate 110 made of synthetic quartz and the like is not substantially etched with a chlorinated gas, it is possible to take a sufficiently high etching selective ratio of the first layer 121 to the transparent substrate 110. As a result, high precision patterning can be achieved when a photomask is formed.

In the first example, since the second layer 122 formed of a tantalum silicide material is prepared as one layer of the halftone phase shift film 120, a photomask produced using this blank is applicable to exposure light of the short wavelength, including fluorinated krypton excimer laser (wavelength is 248 nm) and fluorinated argon excimer laser (wavelength is 193 nm).

In the first example, for the purpose of obtaining some good phase shift effects when a halftone phase shift photomask is produced, the halftone phase shift film 120 is formed on the transparent substrate 110 so that the phase difference φ that is obtained from the following expression when m=4, is within the range of nπ±π/3 radian (here, n is an odd number):

$$\phi = \sum_{k=1}^{3} x^{k,k+1} + \sum_{k=2}^{3} 2\pi(u_k - 1)d_k/\lambda$$

wherein, φ is a phase change caused to light vertically transmitting through a blank for a photomask in which the halftone phase shift film 120 with 2 layer construction is formed on the transparent substrate 110, $\chi^{k,k+1}$ is a phase change occurring in the interface between a $k^{th}$ layer and a $(k+1)^{th}$ layer, $u_k$ and $d_k$ are the refractive index and film thickness of the $k^{th}$ layer (the first layer 121 of a chromium material and the second layer 122 of a tantalum silicide material) respectively, and $\lambda$ is the wavelength of exposure light, providing that the layer of k=1 is the transparent substrate 110 and the layer of k=m is air.

Moreover, in order to obtain a substantial phase shift effect when a halftone phase shift photomask is produced, the halftone phase shift film 120 is formed in such a film thickness as the halftone phase shift film 120 has a transmittance of exposure light within the range of 1 to 50% provided that the transparent substrate 110 has a transmittance of exposure light as 100%.

As the first layer 121 having an element composition comprising chromium as an essential element, it is possible to form a chromium metal layer, a chromium oxide layer, a chromium nitride layer, a chromium oxide nitride layer or others, all of which can be etched with a chlorinated gas. This first layer 121 made of a chromium material can be easily formed by the sputtering method that has been conventionally applied for forming thin films for photomasks. If metal chromium is used as a target and a mixed gas in which oxygen and/or nitrogen are mixed with a sputtering gas of argon is used, the chromium oxide layer, the chromium nitride layer or the chromium oxide nitride layer can be obtained. It is possible to conduct the adjustment and control of a refractive index by changing sputtering pressure or sputtering current, as well as changing the mixing ratio of gases. It is possible to form such a thin film made of a material of chromium compounds by applying technologies, including the vacuum deposition, the CVD method, the ion plating method and the ion beam sputtering method, as well as the sputtering method.

The second layer 122 made of a material having an element composition comprising tantalum, silicon and oxygen as essential elements can be easily formed by the sputtering method that has been conventionally applied for forming thin films for photomasks. For example, a tantalum silicide oxide film can be obtained by using tantalum silicide as a target and by using a mixed gas in which oxygen is mixed with a sputtering gas of argon. It is possible to conduct the adjustment and control of the refractive index of a tantalum silicide oxide film by changing sputtering pressure or sputtering current, as well as changing the mixing ratio of gases. It is possible to form such a thin film made of tantalum silicides by applying technologies, including the vacuum deposition, the CVD method, the ion plating method and the ion beam sputtering method, as well as the sputtering method.

Synthetic quartz as the transparent substrate 110 is transparent to exposure light of the short wavelength, including fluorinated krypton excimer laser (wavelength is 248 nm) and fluorinated argon excimer laser (wavelength is 193 nm) and further can take a high etching selective ratio of the first layer 121 to the transparent substrate 110 in cases where the first layer 121 of a chromium compounds based-thin film is subjected to etching processing with a chlorinated gas when producing a photomask.

Figure 2:
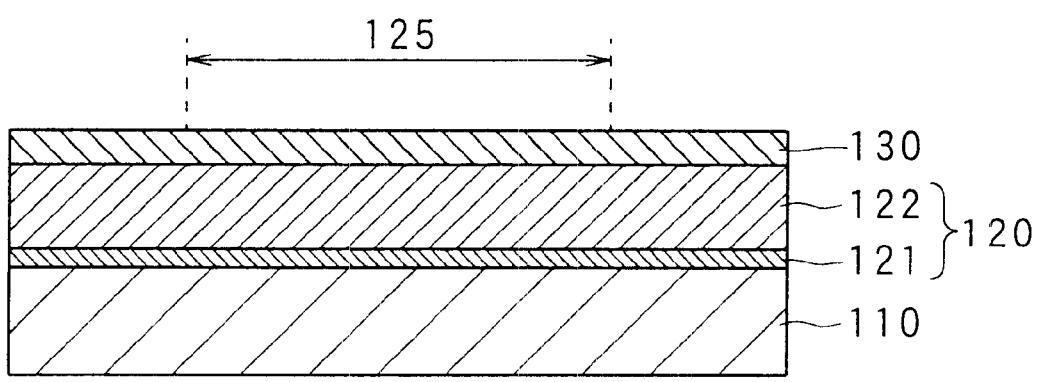
FIG. 2 is a view schematically showing a section of an example (a second example) of the a blank for a halftone phase shift photomask in the present invention.

Next, another example of a blank for a halftone phase shift photomask in the present invention will be explained. FIG. 2 is a schematically sectional view showing a second example of the blank for a halftone phase shift photomask in the present invention. In FIG. 2, a reference numeral 110 denotes a transparent substrate, 120 denotes a halftone phase shift film with multilayer construction, 121 denotes a first layer having an element composition comprising chromium as an essential element, 122 denotes a second layer having an element composition comprising tantalum, silicon and oxygen as essential elements, 125 denotes a halftone pattern area (a shift layer pattern area), and 130 denotes a light shielding layer (also referred to as a substantial light shielding film). The Blans for a halftone phase shift photomask in the second example has the constitution in which the light shielding layer 130 is provided on the halftone phase shift film of that in the first example.

The light shielding layer 130 should be finally removed from the halftone pattern area (shift layer pattern area) 125 to be remained only in peripheral parts of the halftone pattern area 125, and is needed to substantially have a light shielding property so as to prevent undesirable solarization caused by the multiplex exposure of adjoining shots in wafer exposure process and to form an alignment mark and others. Specifically, transmittanse of the light shielding layer is usually made not more than 1% with respect to the exposure light.

A layer of chromium-based metals such as metal chromium, chromium oxide, chromium nitride, chromium oxide nitride and the like is generally used as the light shielding layer 130, but it is not limited to these materials. These films made of chromium compounds can be formed by applying technologies, including the sputtering method, the vacuum deposition, the CVD method, the ion plating method and the ion beam sputtering method.

Further, in a case where the light shielding layer made of chromium compounds in the blank is etched with the use of a wet etchant to produce a halftone phase shift photomask, it is preferable to previously improve the corrosion resistance of the first layer made of chromium compounds by the method of forming the layer using a material of chromium compounds in which oxygen, fluorine and/or nitrogen are added, or using a material of chromium alloys made with other metals, including silicon and tantalum, and by other methods, as mentioned above.

As variations of blanks in the first and second examples, there may be exemplified one in which the first layer 121 made of chromium compounds is altered to a layer made of another material capable of being etched with a chlorinated gas, for example, a chromium tantalum alloy as a main component. Furthermore, as other materials that can be etched with a chlorinated gas, materials that have an element composition comprising tantalum as an essential element and further containing oxygen and/or nitrogen as needed can be used as mentioned above, and the first layer may be formed with such a material. A layer containing a chromium tantalum alloy as a main component and a layer made of a material that has an element composition comprising tantalum as an essential element and further containing oxygen and/or nitrogen as needed can also be formed in film similarly to a film made of chromium compounds by applying technologies, including the sputtering method, the vacuum deposition, the CVD method, the ion plating method and the ion beam sputtering method.

Figure 3:
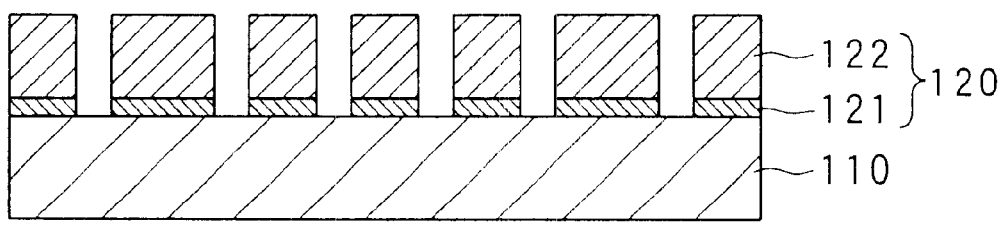
FIG. 3 is a view schematically showing a section of an example (a first example) of a halftone phase shift photomask in the present invention.

Next, examples of a halftone phase shift photomask in the present invention will be explained. FIG. 3 is a schematically sectional view showing a first example of a halftone phase shift photomask in the present invention. This photomask is produced using the above-mentioned first example (FIG. 1) of blank, in which the halftone phase shift film 120 is patterned in the prescribed shape and an aperture is formed, where the surface of the transparent substrate 110 is exposed. Explanation about each layer and optical properties of a photomask in the first example will be omitted because they are the same as those of the blank in the above-mentioned first example.

Figure 4:
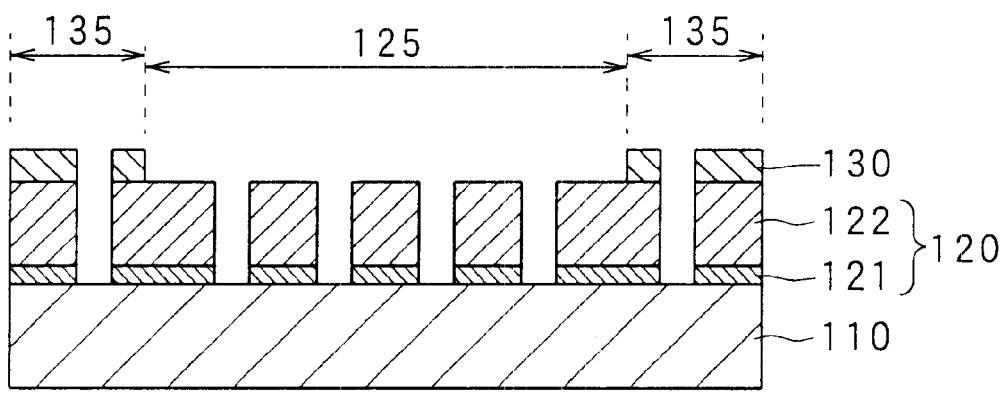
FIG. 4 is a view schematically showing a section of an example (a second example) of the halftone phase shift photomask in the present invention.

FIG. 4 is a schematically sectional view showing a second example of a halftone phase shift photomask in the present invention. This photomask is produced using the above-mentioned second example (FIG. 2) of blank, in which the halftone phase shift film 120 is patterned in the prescribed shape and an aperture is formed, where the surface of the transparent substrate 110 is exposed. Furthermore, in this second example of photomask, the halftone pattern area (shift layer pattern area) 125 for obtaining phase shift effects and the light shielding pattern area 135 for obtaining substantial light shielding effects are prepared. Explanation about each layer and optical properties of a photomask in the second example will be omitted because they are the same as those of the blank in the above-mentioned second example.

As variations of photomasks in the first and second examples, the same variations as those of blanks can be illustrated. That is, it is possible to illustrate such variations as the first layer 121 made of chromium compounds is altered to a layer having another material capable of being etched with a chlorinated gas, for example, a chromium tantalum alloy as a main component or a layer made of a material that has an element composition comprising tantalum as an essential element and further containing oxygen and/or nitrogen as needed.

Figure 5A:
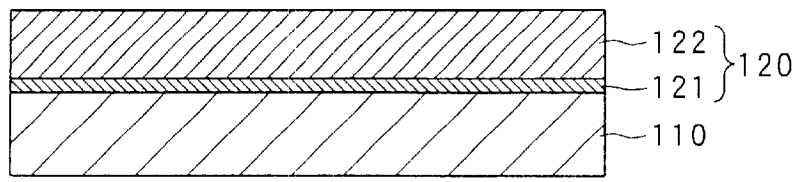
FIG. 5(a) to FIG. 5(e) are views explaining the process of producing the first example of the photomask shown in FIG. 3 with the use of the first example of the blank shown in FIG. 1.
Figure 5B:
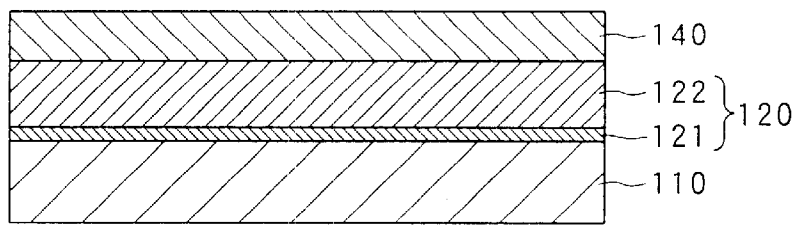

Next, the production method of a halftone phase shift photomask in the present invention will be explained with reference to the accompanying drawings. In FIG. 5, one example of the method of producing a halftone phase shift photomask in the first example is shown. In the production method, first, the blank for a halftone phase shift photomask of the first example (FIG. 1) is provided as shown in FIG. 5(a), and then a resist material is applied on the halftone phase shift film 120 and dried to form the resist layer 140 as shown in FIG. 5(b).

Figure 5C:
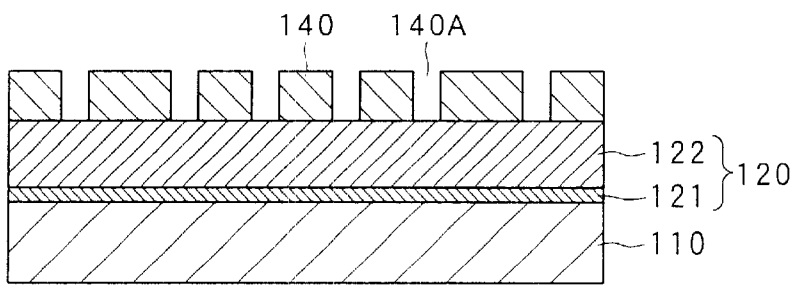

After the resist layer 140 is formed, only a prescribed area of the resist layer 140 is solarized using an electron beam writer as shown in FIG. 5(c), and the resist layer is developed and patterned in conformity with a pattern shape required in the halftone phase shift film 120. An aperture 140A in the resist layer 140 is also formed by the patterning. A resist material is preferable to have easily handling property, prescribed resolution and high dry etching resistance, but not especially limited.

Figure 5D:
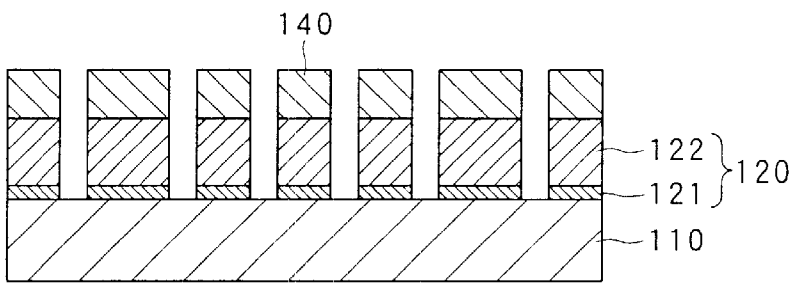
Figure 5E:
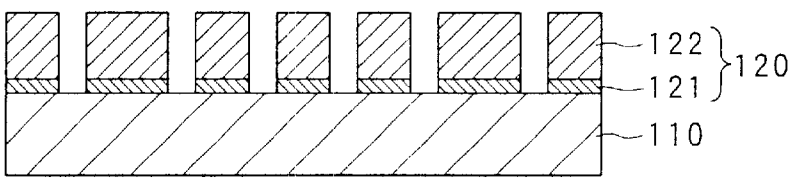

After the resist layer 140 is patterned, the resist layer 140 is used as an etching resistance mask as shown in FIG. 5(d), and the second layer that is a film made of tantalum silicides, and the first layer that is a film made of chromium compounds, of the halftone phase shift film 120 are etched in succession using a fluorinated gas and a chlorinated gas in the order. Then, the pattern of the halftone phase shift film as shown in FIG. 5(e) is obtained by peeling the resist layer 140 off.

Next, one example of a method of producing a halftone phase shift photomask in the second example is shown in FIG. 6. In the production method, patterning processing is carried out similarly to the production method for the first example in the previous step shown in the figure. That is, first, the blank for a halftone phase shift photomask in the second example (FIG. 2) is provided, and a resist material is applied on the light shielding film 130 and dried to form the resist layer 140. Then, only a prescribed area of the resist layer 140 is solarized using an electron beam writer, and the resist layer is developed and patterned in conformity with a pattern shape required in the halftone phase shift film 120.

After the resist layer 140 is patterned, the resist layer 140 is used as an etching resistance mask, and the light shielding film 130, a film made of tantalum silicides that is the second layer of the halftone phase shift film 120 and a film made of chromium compounds that is the first layer of the halftone phase shift film 120 are etched in succession using a fluorinated gas and a chlorinated gas in the order. Then, the pattern of the halftone phase shift film is obtained by peeling the resist layer 140 off.

Figure 6A:
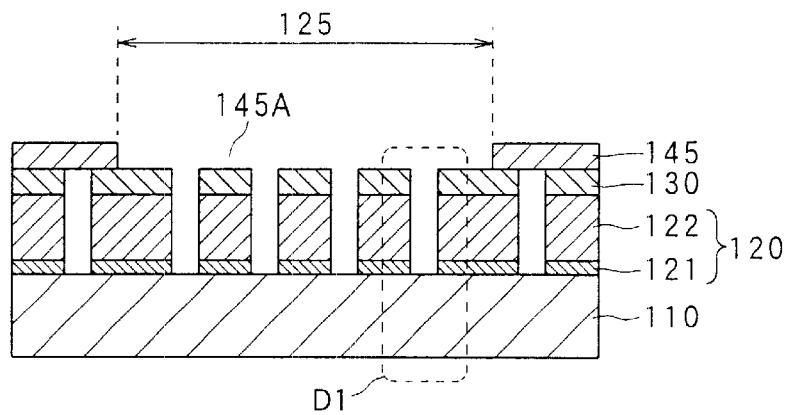
FIG. 6(a) to FIG. 6(d) are views explaining the process of producing the second example of the photomask shown in FIG. 4 with the use of the second example of the blank shown in FIG. 2. In particular.
Figure 6B:
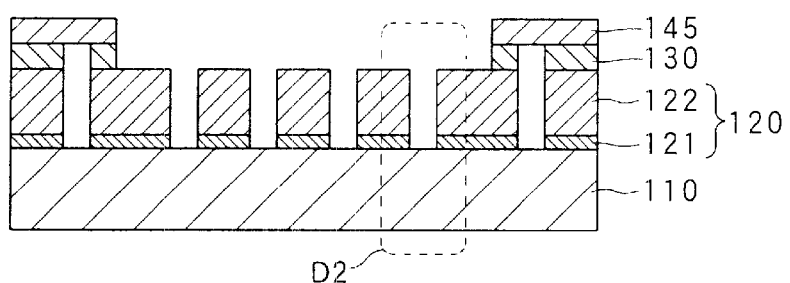

Processes to this step are the same as those in the production method in the first example. After that, a resist layer 145 is newly formed on the light shielding layer 130 and is patterned by exposing and developing as shown in FIG. 6(a). This new resist layer 145 is formed only on a light shielding pattern area 135 that is desired to finally obtain substantial light shielding effects and is patterned in a shape having an aperture 145A. Said aperture 145A is in accord with the halftone pattern area (shift layer pattern area) 125 which should obtain phase shift effects. After that, this resist layer 145 is used as an etching resistance mask as shown in FIG. 6(b), and the light shielding layer of aperture 145A is removed by conducting wet etching with a wet etchant of cerium nitrates. After that, when the resist layer 145 is peeled off, a halftone phase shift photomask in the second example is obtained.

Figure 6C:
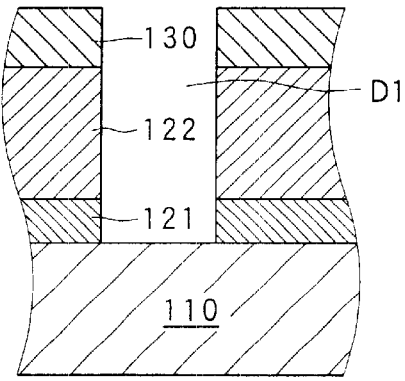
Figure 6D:
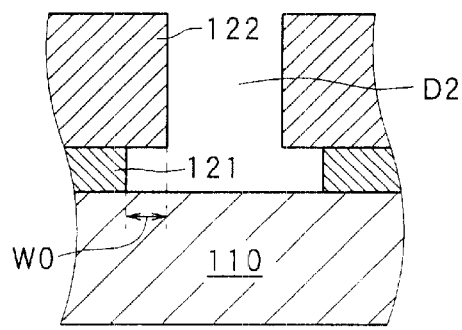

FIG. 6(c) and FIG. 6(d) are enlarged views of D1 part of FIG. 6(a) and D2 part of FIG. 6(b), respectively. At the time of wet etching, it is feared that the first layer 121, which is a film made of chromium compounds, is etched and becomes to be as shown in enlarged FIG. 6(d) to cause some problems in pattern. However, the first layer 121, which is a film made of chromium compounds, has generally low possibility of being invaded as shown in FIG. 6(d) because its film thickness is thin. And, even if the layer is invaded, the invasion is considered to stop in the degree substantially not to adversely affect its transcription properties.

Furthermore, corrosion resistance of the first layer of the film made of chromium compounds to wet etchants can be improved by adding fluorine and/or nitrogen to the first layer or by making an alloy through the addition of an other metal like silicon, tantalum or the like. As a result, the part of WO shown in FIG. 6(d) can be extremely small, so adverse effects to the transcription properties can be certainly prevented.

A halftone phase shift photomask in the above-mentioned variation examples can be produced fundamentally by the same procedure as the production method of the first and second examples.

EXAMPLES

Example 1

An example of a blank for a halftone phase shift photomask applicable to KrF exposure in the present invention will be explained with reference to FIG. 7. In this example, too, a halftone phase shift film 120 will be constituted of 2 layers.

Figure 7A:
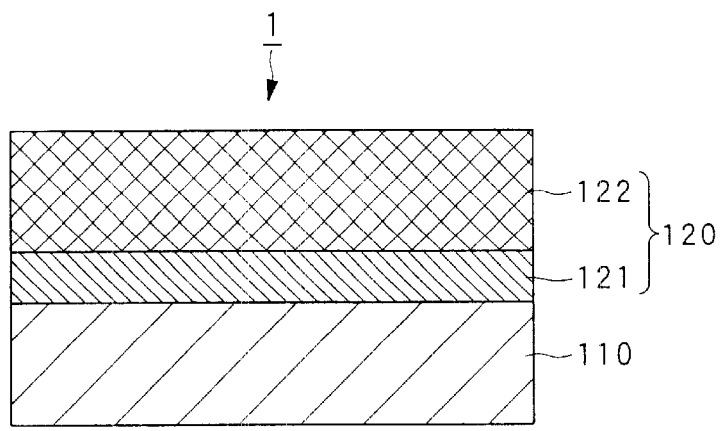
FIG. 7(a) and FIG. 7(b) are views schematically showing the production process of a blank for a halftone phase shift photomask and the section of the obtained blank in example 1. In particular.

As shown in FIG. 7(a), a first layer 121 of a halftone phase shift film was formed on a substrate 110 of optically polished and sufficiently washed high purity synthetic quartz with 6 inches square and 0.25 inch in thickness under conditions as shown in the following. The thickness of the first layer 121 was made to be about 25 nm.

<Film Forming Conditions>
Film forming device: Planer type DC magnetron sputtering device
Target: Tantalum metal
Gas and its flow rate: Argon gas, 50 sccm
Sputtering pressure: 0.3 Pa
Sputtering current: 3.0 A Next, a second layer 122 of a halftone phase shift film was formed on the first layer under conditions as shown in the following. The thickness of the second layer 122 was made to be about 140 nm.
<Film Forming Conditions>
Film forming device: Planer type DC magnetron sputtering device
Target: Tantalum: Silicon=1:3 (atomic ratio)
Gas and its flow rate: Argon gas, 50 sccm+Oxygen gas, 50 sccm
Sputtering pressure: 0.3 Pa
Sputtering current: 3.5 A Thus, the blank 1 for a halftone phase shift photomask, which are applicable to KrF excimer laser exposure and have the transmittance of 6%, were obtained. Optical properties of the blank are shown in FIG. 8.

Figure 7B:
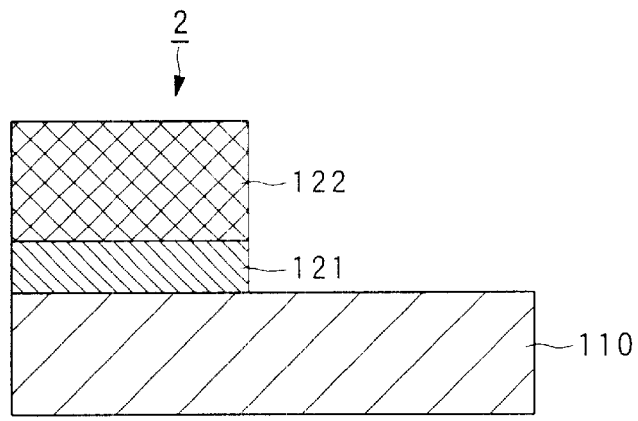

Moreover, as shown in FIG. 7(b), the first layer and second layer of a halftone phase shift film were formed under the same conditions as mentioned above on the synthetic quartz substrate that had been masked with a tape in advance, and test piece 2 was obtained. Using this test piece 2, phase difference and transmittance to light of 248 nm in wavelength were measured with a commercially available phase difference measuring device (MPM248, produced by Laser Tech. Co. Ltd.). Measured values were 182.62° and 5.37%, respectively.

Next, concerning this test piece 2, its resistance to chemical solutions like washing liquids, etching liquids and others used in the production process of photomasks was investigated. The results are shown in the following TABLE 1.
Chemical solution (a): Sulfuric acid: nitric acid=10:1 (volume ratio), 80° C. of the temperature
Chemical solution (b): 10% aqueous ammonia, room temperature
Chemical solution (c): Commercially available Chromium etchant (MR-ES, produced by Ink Tech. Co. Ltd.), room temperature

TABLE 1

| Chemical solution | Dipping duration | Change in phase difference | Change in transmittance |
|---|---|---|---|
| (a) | 2 hours | −0.11° | +0.01% |
| (b) | 2 hours | −0.05° | +0.00% |
| (c) | 2 hours | −0.03° | +0.02% |

Example 2

An example of a halftone phase shift photomask in the present invention will be explained with reference to FIG. 9. In this example, too, a halftone phase shift film 120 will be constituted of 2 layers.

Figure 9A:
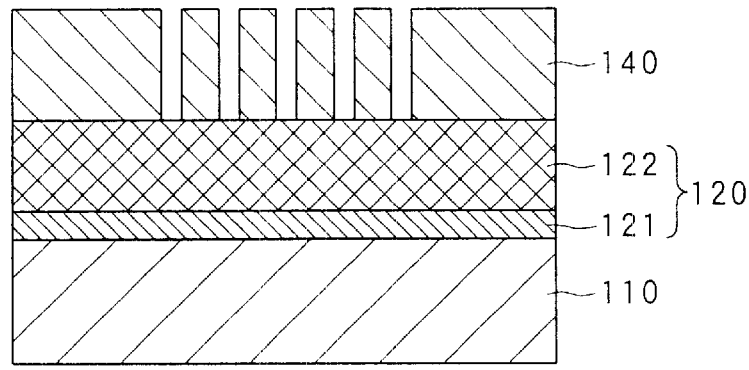
FIG. 9(a) to FIG. 9(c) are views schematically showing the production process of a blank for a halftone phase shift photomask and the section of the obtained blank in example 2.

As shown in FIG. 9(a), a resist material was applied on the blank 1 obtained in example 1 and then the usual method of electron beam lithography or photo lithography was carried out to form a resist layer 140 containing organic compounds as main components and having a prescribed pattern.

Figure 9B:
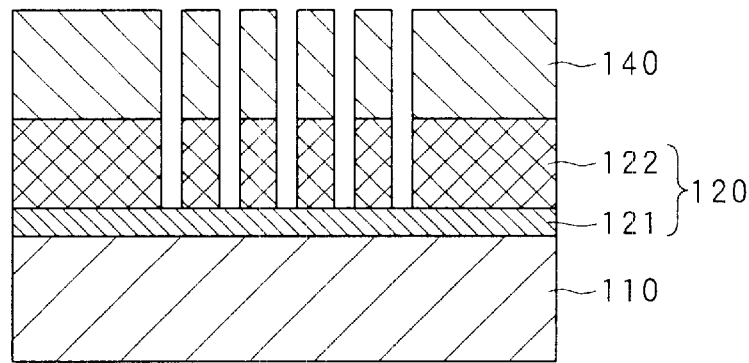
Figure 9C:
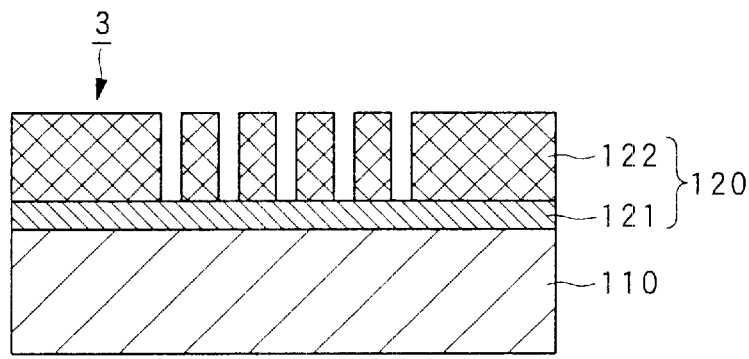

Next, as shown in FIG. 9(b), second layer 122 and first layer 121 on a halftone phase shift film having exposed portions at an aperture of the resist layer 140 were selectively dry etched successively by exposing to high density plasma and the halftone phase shift film 120 was patterned in the prescribed shape by means of a commercially available dry etcher for photomasks (VLR700, produced by PTI Co. Ltd.). The dry etcher used in this example has 2 etching treatment chambers, and following conditions 1 and 2 were carried out in separate treatment chambers.
<Condition 1>
Etching gas: $CF_4$ gas
Pressure: 10 mTorr
ICP power (high density plasma generation): 950 W
Bias power (drawing power): 50 W
Time: 360 sec
<Condition 2>
Etching gas: $Cl_2$ gas
Pressure: 3 mTorr
ICP power (high density plasma generation): 500 W
Bias power (drawing power): 25 W
Time: 200 sec Next, the remaining resist layer 140 was peeled off in the usual manner to make a halftone phase shift photomask 3 as shown in FIG. 9(c). The transmittance of the halftone phase shift part in this photomask 3 to light of 248 nm in wavelength was 6%. It was noticeable that synthetic quartz is hardly etched in the etching process of the condition 2 and phase difference can be controlled in extremely high precision.

Furthermore, it was possible to put this halftone phase shift photomask 3 to practical use in every respect of the dimensional accuracy, the sectional shape, the film thickness distribution, the transmittance distribution and the film adhesion to the substrate.

Example 3

Concerning blanks for a halftone phase shift photomask applicable to KrF exposure in the present invention, the example of blank in which the film surface reflectance at 248 nm wavelength was lowered as compared to the blank in example 1 will be explained with reference to FIG. 10. In this example, lowered reflectance was realized by adding a minute amount of oxygen to the first layer substantially not containing silicon out of 2 layers constituting a halftone phase shift film 120.

Figure 10A:
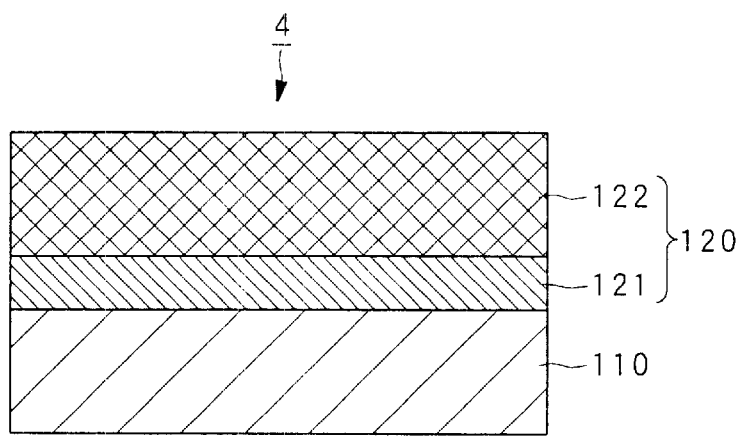
FIG. 10(a) and FIG. 10(b) are views schematically showing the production process of a blank for a halftone phase shift photomask and the section of the obtained blank in example 3. In particular.

As shown in FIG. 10(a), a first layer 121 of a half tone phase shift film was formed on a substrate 110 of optically polished and sufficiently washed high purity synthetic quartz of 6 inches square and 0.25 inch in thickness under conditions as shown in the following. The thickness of the first layer 121 was made to be about 40 nm.
<Film Forming Conditions>
Film forming device: Planer type DC magnetron sputtering device
Target: Tantalum metal
Gas and its flow rate: Argon gas, 40 sccm+Oxygen gas, 5 sccm
Sputtering pressure: 0.3 Pa
Sputtering current: 2.0 A Next, a second layer 122 of a halftone phase shift film was formed on the first layer under conditions as shown in the following. The thickness of the second layer 122 was made to be about 90 nm.
<Film Forming Conditions>
Film forming device: Planer type DC magnetron sputtering device
Target: Tantalum: Silicon 1:3 (atomic ratio)
Gas and its flow rate: Argon gas, 50 sccm+Oxygen gas, 50 sccm Sputtering pressure: 0.3 Pa
Sputtering current: 3.5 A Thus, the blank 4 for a halftone phase shift photomask, which are applicable to KrF excimer laser exposure and which have the transmittance of 6%, was obtained. Optical properties of the blank are shown in FIG. 11. The film surface reflectance of the blank in example 1 at 248 nm wavelength was about 43% as shown in FIG. 8, while in this example, the film surface reflectance could be lowered to the degree of 2%, resulting in the realization of lowered reflectance.

Figure 10B:
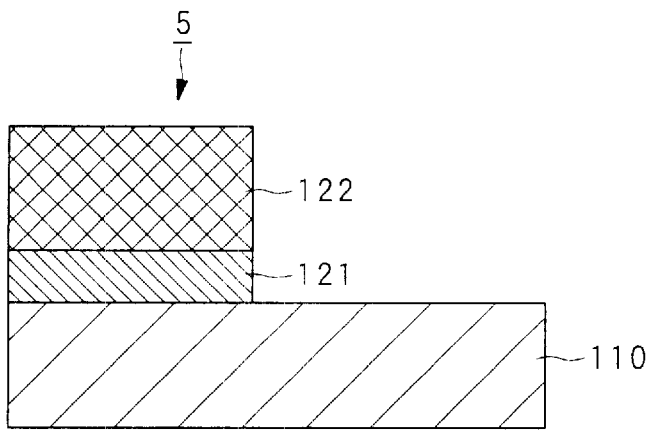

Moreover, as shown in FIG. 10(b), the first layer and second layer of a halftone phase shift film were formed under the same conditions as mentioned above on the synthetic quartz substrate that had been masked with a tape in advance, and test piece 5 was obtained. Using this test piece 5, phase difference and transmittance to light of 248 nm in wavelength were measured by means of a commercially available phase difference measuring device (MPM248, produced by Laser Tech. Co. Ltd.). Measured values were 186.59° and 6.07%, respectively.

Example 4

Example 4 is an example in which a halftone phase shift photomask in the first example shown in FIG. 3 was produced by the production method shown in FIG. 5 using the blank for a halftone phase shift photomask in the first example shown in FIG. 1. In this example, a halftone phase shift photomask applicable to KrF exposure was produced.

A first layer 121 of a halftone phase shift film was formed on a transparent substrate 110 of optically polished and sufficiently washed high purity synthetic quartz of 6 inches square and 0.25 inch in thickness under conditions as shown in the following. The first layer 121 was made of chromium compounds and its thickness was made to be about 10 nm.
<Film Forming Conditions>
Film forming device: Planer type DC magnetron sputtering device
Target: Chromium metal
Gas and its flow rate: Argon gas, 70 sccm
Sputtering pressure: 0.35 Pa
Sputtering current: 5.0 A Next, a second layer 122 of a halftone phase shift film was formed on the first layer under conditions as shown in the following. The second layer 122 was made of tantalum silicides with an element composition comprising tantalum, silicon and oxygen as essential elements. The thickness of the second layer 122 was made to be about 140 nm.
<Film Forming Conditions>
Film forming device: Planer type DC magnetron sputtering device
Target: Tantalum: Silicon=1:3 (atomic ratio)
Gas and its flow rate: Argon gas, 50 sccm+Oxygen gas, 50 sccm
Sputtering pressure: 0.3 Pa
Sputtering current: 3.5 A Thus, the blank for a halftone phase shift photomask, which are applicable to KrF excimer laser exposure and which have the transmittance of 6%, was obtained.

Figure 12:
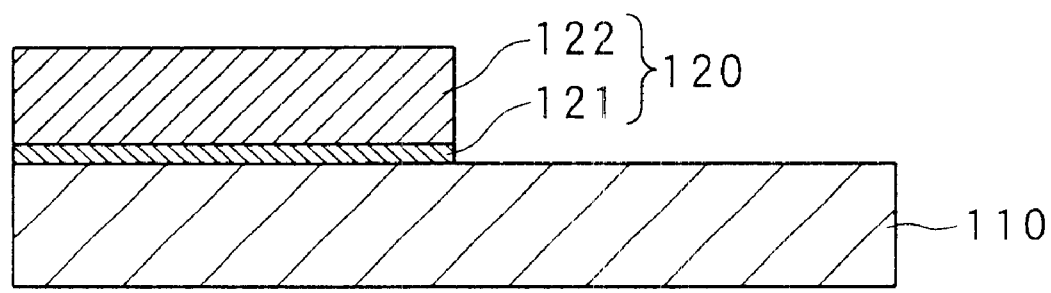
FIG. 12 shows the section of a test piece obtained by a lift off method in examples 4, 5 and 6.

Further, the lift-off method was also carried out to make a test piece as shown in FIG. 12. That is, after the first layer and second layer of a halftone phase shift film were formed under the same conditions as mentioned above on the synthetic quartz substrate that had been masked with a tape in advance, the masked tape was peeled off to make a test piece by means of difference in level. Using this test piece, phase difference and transmittance to light of 248 nm in wavelength were measured with a commercially available phase difference measuring device (MPM248, produced by Laser Tech. Co. Ltd.). Measured values were 179.22° and 5.88%, respectively.

Next, a halftone phase shift photomask in the first example as shown in FIG. 3 was produced with the use of the obtained blank. First, as shown in FIG. 5(a), the blank for a halftone phase shift photomask was provided, and then resist material "ZEP7000" containing organic compounds as main components (produced by Nippon Zeon Co. Ltd.) was applied on the halftone phase shift film 120 of this blank and dried to form a resist layer 140 as shown in FIG. 5(b). Next, as shown in FIG. 5(c), the resist layer 140 was patterned in the prescribed shape by exposing only the prescribed area of the resist layer by means of an electron beam writer and then developing.

Next, as shown in FIG. 5(d), the second layer 122 and the first layer 121 of a halftone phase shift film at an aperture of the resist layer 140 where the halftone phase shift film was exposed were selectively dry etched successively by exposing to high density plasma and the halftone phase shift film 120 was patterned in the prescribed shape by means of a commercially available dry etcher for photomasks (VLR700, produced by PTI Co. Ltd.). The dry etcher used in this example has 2 etching treatment chambers, and following condition 1 and 2 were carried out in separate treatment chambers.
<Condition 1>
Etching gas: $CF_4$ gas
Pressure: 10 mTorr
ICP power (high density plasma generation): 950 W
Bias power (drawing power): 50 W
Time: 360 sec
<Condition 2>
Etching gas: $Cl_2$ gas+$O_2$ gas (2:3)
Pressure: 100 mTorr
ICP power (high density plasma generation): 500 W
Bias power (drawing power): 25 W
Time: 200 sec Next, the remaining resist layer 140 was peeled off in the usual manner to make a halftone phase shift photomask as shown in FIG. 5(e). The transmittance of the halftone phase shift part in this photomask to light of 248 nm in wavelength was 6%. It was noticeable that the transparent substrate 110 of synthetic quartz is hardly etched in the etching process of the condition 2 and phase difference can be controlled in extremely high precision.

Furthermore, it was possible to put this halftone phase shift photomask to practical use in every respect of the dimensional accuracy, the sectional shape, the film thickness distribution, the transmittance distribution and the film adhesion to a substrate.

Example 5

Example 5 is an example in which a halftone phase shift photomask in the second example shown in FIG. 4 was produced by a series of production methods shown in FIG. 5 and FIG. 6 using a blank for a halftone phase shift photomask in the second example shown in FIG. 2. In this example, a halftone phase shift photomask for KrF exposure was produced. And, in consideration of wetly etching a light shielding film made of chromium in this example, corrosion resistance of the first layer made of chromium compounds was improved by adding tantalum.

First, a first layer 121 of a halftone phase shift film was formed on a transparent substrate 110 of optically polished and sufficiently washed high purity synthetic quartz of 6 inches square and 0.25 inch in thickness under conditions as shown in the following. The first layer 121 was made of tantalum chromium alloys and its thickness was made to be about 10 nm.
<Film Forming Conditions>
Film forming device: Planer type DC magnetron sputtering device
Target: Tantalum chromium alloy (Tantalum: Chromium=1:9)
Gas and its flow rate: Argon gas, 70 sccm
Sputtering pressure: 0.35 Pa
Sputtering current: 5.0 A Next, a second layer 122 of a halftone phase shift film was formed on the first layer under conditions as shown in the following. The second layer 122 was made of tantalum silicides with an element composition comprising tantalum, silicon and oxygen as essential elements. The thickness of the second layer 122 was made to be about 90 nm.
<Film Forming Conditions>
Film forming device: Planer type DC magnetron sputtering device
Target: Tantalum: Silicon=1:3 (atomic ratio)
Gas and its flow rate: Argon gas, 50 sccm+Oxygen gas, 50 sccm
Sputtering pressure: 0.3 Pa
Sputtering current: 3.5 A Next, a light shielding film 130 was formed on the halftone phase shift film 120 by the sputtering method. The light shielding film 130 was made of chromium metal, and its thickness was made to be 1000 angstroms (Å).
<Sputtering Conditions of a Light Shielding Film>
Film forming device: Planer type DC magnetron sputtering device
Target: Chromium metal
Gas and its flow rate: Argon gas, 50 sccm
Sputtering pressure: 0.3 Pa
Sputtering current: 3.5 A Thus, a blank for a halftone phase shift photomask that are applicable to KrF excimer laser exposure and which have the transmittance of 6%, was obtained.

Further, the lift-off method was also carried out to make a test piece as shown in FIG. 12. That is, after the first layer and second layer of a halftone phase shift film were formed under the same conditions as mentioned above on the synthetic quartz substrate that had been masked with a tape in advance, the masked tape was peeled off to make a test piece with difference in level. Using this test piece, phase difference and transmittance to light of 248 nm in wavelength were measured by means of a commercially available phase difference measuring device (MPM248, produced by Laser Tech. Co. Ltd.). Measured values were 180.12° and 6.33%, respectively.

After this test piece with difference in level was immersed in a commercially available chromium etchant (MR-ES produced by Ink Tech. Co. Ltd.) at room temperature for 240 seconds, the section of the pattern portion was observed by means of the SEM (scanning electron microscope), and thus no corrosion as shown in FIG. 6(d) was found.

For comparison with this test piece, after the test pieces with difference in level produced in example 4 were also immersed in a commercially available chromium etchant (MR-ES produced by Ink Tech. Co. Ltd.) at room temperature for 180 seconds and 240 seconds, respectively, the section of the pattern portion of each test piece was observed by means of the SEM. As a result, no corrosion was found in the test piece immersed for 180 seconds, but some corrosion as shown in FIG. 6(d) was observed in the test piece immersed for 240 seconds. By this comparison, it was confirmed that the corrosion resistance of the first layer in example 5 had been improved in comparison with the first layer in example 4.

Next, a halftone phase shift photomask in the second example as shown in FIG. 4 was produced with the use of the obtained blank. First, resist material "ZEP7000" containing organic compounds as main components (produced by Nippon Zeon Co. Ltd.) was applied on the light shielding layer 130 and dried to form a resist layer 140. Next, the resist layer 140 was patterned in the prescribed shape by exposing only the prescribed area of the resist layer by means of an electron beam writer and then developing.

Next, the light shielding layer 130 at a portion exposing through an aperture of the resist layer 140 and the halftone phase shift film 120 just under the exposed portion were selectively dry etched successively by exposing to high density plasma to pattern the light shielding layer 130 and the halftone phase shift film 120 in the prescribed shapes by means of a commercially available dry etcher for photomasks (VLR700, produced by PTI Co. Ltd.). In this example, etching conditions 1, 2 and 3 were carried out in this order, that is, etching of light shielding layer 130 by etching condition 1, the second layer by etching condition 2 and the first layer by etching condition 3 (the same as condition 1) was carried out in succession. The dry etcher used in this example has 2 etching treatment chambers, and following conditions 1 and 3 were carried out in the same treatment chamber, and condition 2 was carried out in the different treatment chamber.
<Condition 1: Etching of the Light Shielding Layer>
Etching gas: $Cl_2$ gas+$O_2$ gas (2:3)
Pressure: 100 mTorr
ICP power (high density plasma generation): 500 W
Bias power (drawing power): 25 W
Time: 200 sec
<Condition 2: Etching of the Second Layer>
Etching gas: $CF_4$
Pressure: 10 mTorr
ICP power (high density plasma generation): 950 W
Bias power (drawing power): 50 W
Time: 360 sec
<Condition 3: Etching of the First Layer>
Etching gas: $Cl_2$ gas+$O_2$ gas (2:3)
Pressure: 100 mTorr
ICP power (high density plasma generation): 500 W
Bias power (drawing power): 25 W
Time: 200 sec Next, resist material "IP3500" (produced by Tokyo Ohka Kogyo Co. Ltd.) was applied again on this layer and dried, and then photo lithography was carried out to form a resist layer 145 having apertures only in areas desired to expose the halftone phase shift film as shown in FIG. 6(a). After that, wet etching was carried out under the following condition to selectively remove the exposed light shielding layer 130 at an aperture 145A of the resist layer as shown in FIG. 6(b). And the remaining resist layer 145 was peeled off in the usual manner to make a halftone phase shift photomask.

The transmittance of the halftone phase shift part in this photomask to light of 248 nm in wavelength was 6%. Furthermore, in the halftone phase shift film in this photomask, no problem due to corrosion as shown in FIG. 6(d) was found in the first layer 121 made of chromium compounds. In this example, too, the transparent substrate 110 was not etched under etching condition 3 similarly to example 4 and phase difference could be controlled in extremely high precision.

Furthermore, it was possible to put this halftone phase shift photomask to practical use in every respect of the dimensional accuracy, the sectional shape, the film thickness distribution, the transmittance distribution and the film adhesion to a substrate.

Example 6

Figure 13:
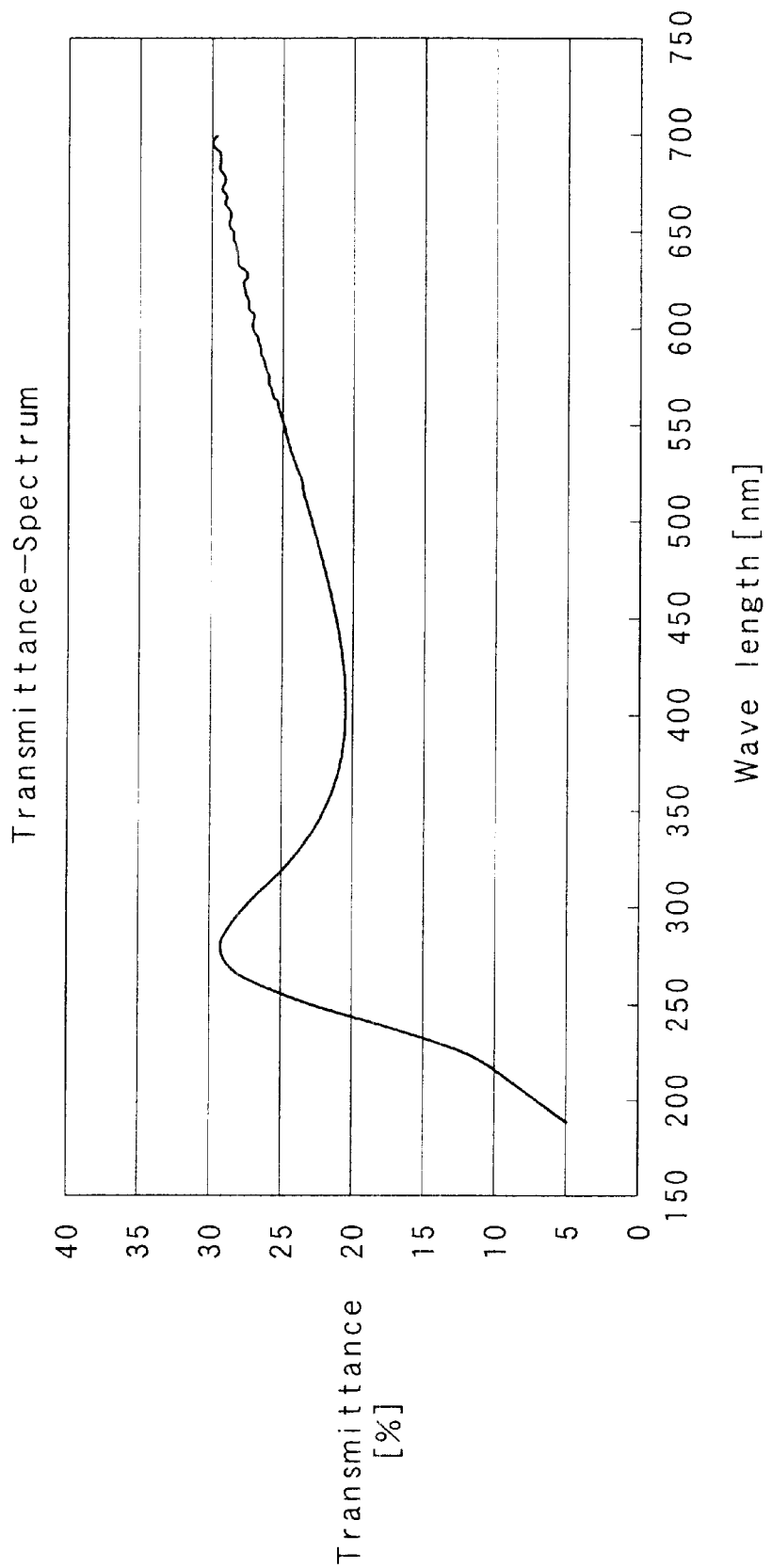
FIG. 13 is a graph showing the transmission spectrum of the blank obtained in example 6.
Figure 14A:
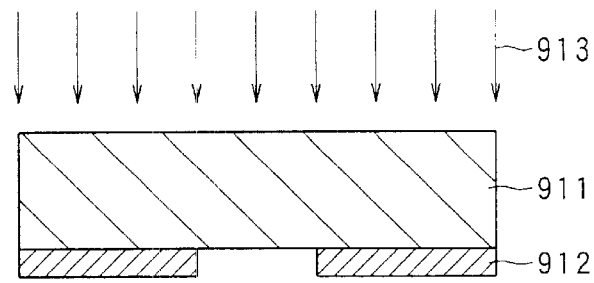
FIG. 14(a) to FIG. 14(d) are views explaining the principle of a halftone phase shift photo lithography.
Figure 14B:
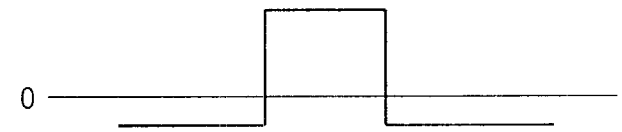
Figure 14C:
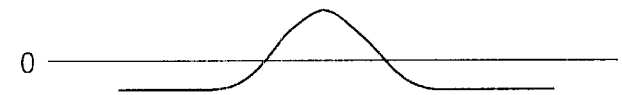
Figure 14D:
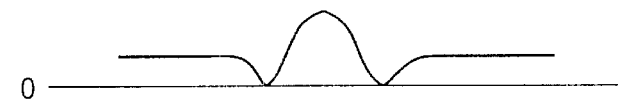
Figure 15A:
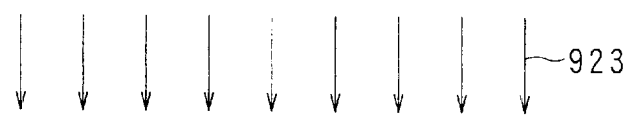
FIG. 15(a) to FIG. 15(d) are views explaining the principle of a conventional photomasking method.
Figure 15B:
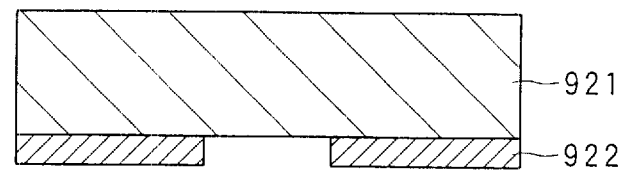
Figure 15C:
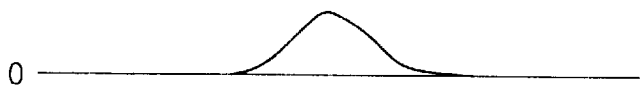
Figure 15D:
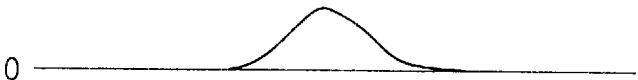

Also in the example 6, a halftone phase shift photomask in the second example shown in FIG. 4 was produced by a series of production methods shown in FIG. 5 and FIG. 6 using the blank for a halftone phase shift photomask in the second example shown in FIG. 2. In this example, the film forming condition of the first layer and the etching condition of the first layer (corresponding to etching condition 3 in example 5) were set as the following. Other conditions were the same as those in example 5. The optical characteristic spectrum (transmittance spectrum) of the thus obtained blank is shown in FIG. 13.

<The Film Forming Condition of the Layer>
Film forming device: Planer type DC magnetron sputtering device
Target: Tantalum chromium alloy (Tantalum: Chromium= 97:3)
Gas and its flow rate: Argon gas, 95 sccm
Sputtering pressure: 1.0 Pa
Sputtering current: 1.0 A
<The Etching Condition of the First Layer>
Etching gas: $Cl_2$ gas
Pressure: 3 mTorr
ICP power (high density plasma generation): 250 W
Bias power (drawing power): 25 W
Time: 250 sec

What is claimed is:

1. A blank for a halftone phase shift photomask comprising a transparent substrate and a halftone phase shift film provided on said transparent substrate, wherein said halftone phase shift film has a multilayer construction in which at least a first layer capable of being etched with a chlorinated gas and a second layer capable of being etched with a fluorinated gas are disposed in this order from the side near to said transparent substrate.

2. A blank for a halftone phase shift photomask according to claim 1, wherein said second layer has an element composition comprising tantalum, silicon and oxygen as essential elements.

3. A blank for a halftone phase shift photomask according to claim 1, wherein said f irst layer has an element composition comprising tantalum as an essential element and said second layer has an element composition comprising tantalum, silicon and oxygen as essential elements.

4. A blank for a halftone phase shift photomask according to claim 3, wherein said first layer has an element composition further containing oxygen and/or nitrogen as essential elements.

5. A blank for a halftone phase shift photomask according to claim 1, wherein said first layer has an element composition comprising chromium as an essential element and said second layer has an element composition comprising tantalum, silicon and oxygen as essential elements.

6. A blank for a halftone phase shift photomask according to claim 5, wherein said first layer has an element composition further containing oxygen, fluorine and/or nitrogen as essential elements.

7. A blank for a halftone phase shift photomask according to claim 5, wherein said first layer has an element composition further containing silicon as an essential element.

8. A blank for a halftone phase shift photomask according to claim 7, wherein said first layer has an element composition further containing oxygen, fluorine and/or nitrogen as essential elements.

9. A blank for a halftone phase shift photomask according to claim 5, wherein said first layer has an element composition further containing tantalum as an essential element.

10. A blank for a halftone phase shift photomask according to claim 9, wherein said first layer has an element composition further containing oxygen, fluorine and/or nitrogen as essential elements.

11. A blank for a halftone phase shift photomask according to claim 9, wherein said first layer has an element composition further containing silicon as an essential element.

12. A blank for a halftone phase shift photomask according to claim 11, wherein said first layer has an element composition further containing oxygen, fluorine and/or nitrogen as essential elements.

13. A blank for a halftone phase shift photomask according to claim 1, wherein a halftone phase shift film is formed on a transparent substrate so as to have a phase difference $\phi$ within the range of $n\pi \pm \pi/3$ radian (n is an odd number) according to the following expression:

$$\phi = \sum_{k=1}^{m-1} \chi^{k,k+1} + \sum_{k=2}^{m-1} 2\pi(u_k - 1)d_k / \lambda$$

wherein, $\phi$ is a phase change caused to light vertically transmitting through the blank for a photomask in which a multilayer film with (m−2) layers is disposed on said transparent substrate, $\chi^{k,k+1}$ is a phase change occurring in the interface between a $k^{th}$ layer and a $(k+1)^{th}$ layer, $u_k$ and $d_k$ are the refractive index and film thickness of a material forming the $k^{th}$ layer, respectively, and $\lambda$ is the wavelength of exposure light, providing that the layer of k=1 is said transparent substrate and the layer of k=m is air.

14. A blank for a halftone phase shift photomask according to claim 1, wherein a halftone phase shift film is formed on said transparent substrate so as to have a film thickness with the transmittance of exposure light within the range of 1 to 50% when the transmittance of exposure light of the transparent substrate is defined as 100%.

15. A blank for a halftone phase shift photomask according to claim 1, wherein the absolute reflectance of the surface on which a halftone phase shift film is formed is from 0 to 30% with respect to exposure light.

16. A blank for a halftone phase shift photomask according to claim 1, wherein a light shielding film having an element composition comprising chromium as an essential element is formed on the halftone phase shift film in succession.

17. A blank for a halftone phase shift photomask according to claim 1, wherein a light shielding film having an element composition comprising chromium as an essential element is formed under the halftone phase shift film in succession.

18. A halftone phase shift photomask comprising a transparent substrate and a halftone phase shift film provided on said transparent substrate, wherein said halftone phase shift film has a multilayer construction in which at least a first layer capable of being etched with a chlorinated gas and a second layer capable of being etched with a fluorinated gas are disposed in this order from the side near said transparent substrate, and said halftone phase shift film also comprises apertures made by removing part of said halftone phase shift film in a prescribed pattern.

19. A Halftone phase shift photomask according to claim 18, wherein said second layer has an element composition comprising tantalum, silicon and oxygen as essential elements.

20. A halftone phase shift photomask according to claim 18, wherein said first layer has an element composition comprising tantalum as an essential element and said second layer has an element composition comprising tantalum, silicon and oxygen as essential elements.

21. A halftone phase shift photomask according to claim 20, wherein said first layer has an element composition further containing oxygen and/or nitrogen as essential elements.

22. A halftone phase shift photomask according to claim 18, wherein said first layer has an element composition comprising chromium as an essential element and said second layer has an element composition comprising tantalum, silicon and oxygen as essential elements.

23. A halftone phase shift photomask according to claim 22, wherein said first layer has an element composition further containing oxygen, fluorine and/or nitrogen as essential elements.

24. A halftone phase shift photomask according to claim 22, wherein said first layer has an element composition further containing silicon as an essential element.

25. A halftone phase shift photomask according to claim 24, wherein said first layer has an element composition further containing oxygen, fluorine and/or nitrogen as essential elements.

26. A halftone phase shift photomask according to claim 22, wherein said first layer has an element composition further containing tantalum as an essential element.

27. A halftone phase shift photomask according to claim 26, wherein said first layer has an element composition further containing oxygen, fluorine and/or nitrogen as essential elements.

28. A halftone phase shift photomask according to claim 26, wherein said first layer has an element composition further containing silicon as an essential element.

29. A halftone phase shift photomask according to claim 28, wherein said first layer has an element composition further containing oxygen, fluorine and/or nitrogen as essential elements.

30. A halftone phase shift photomask according to claim 18, wherein a halftone phase shift film is formed on a transparent substrate so as to have a phase difference $\phi$ within the range of $n\pi \pm \pi/3$ radian (n is an odd number) according to the following expression:

$$\phi = \sum_{k=1}^{m-1} \chi^{k,k+1} + \sum_{k=2}^{m-1} 2\pi(u_k - 1)d_k/\lambda$$

wherein, $\phi$ is a phase change caused to light vertically transmitting through the photomask in which a multilayer film with (m−2) layers is disposed on said transparent substrate, $\chi^{k,k+1}$ is a phase change occurring in the interface between a $k^{th}$ layer and a $(k+1)^{th}$ layer, $u_k$ and $d_k$ are the refractive index and film thickness of a material forming the $k^{th}$ layer, respectively, and $\lambda$ is the wavelength of exposure light, providing that the layer of k=1 is said transparent substrate and the layer of k=m is air.

31. A halftone phase shift photomask according to claim 18, wherein a halftone phase shift film has a transmittance of exposure light within the range of 1 to 50% when the transmittance of exposure light of the transparent substrate is defined as 100%.

32. A halftone phase shift photomask according to claim 18, wherein the absolute reflectance of the surface on which a halftone phase shift film is formed is from 0 to 30% with respect to exposure light.

33. A halftone phase shift photomask according to claim 18, wherein a light shielding film having an element composition comprising chromium as an essential element is formed on a halftone phase shift film in the same pattern.

34. A halftone phase shift photomask according to claim 18, wherein a light shielding film having an element composition comprising chromium as an essential element is formed under a halftone phase shift film in the same pattern.

* * * * *